United States Patent
Tseng

(10) Patent No.: US 9,379,601 B2
(45) Date of Patent: Jun. 28, 2016

(54) CHARGE MODULE, DRIVING CIRCUIT, AND OPERATING METHOD

(71) Applicant: Himax Analogic, Inc., Tainan (TW)

(72) Inventor: Kuan-Jen Tseng, Tainan (TW)

(73) Assignee: HIMAX ANALOGIC, INC., Tainan (TW)

( * ) Notice: Subject to any disclaimer, the term of this patent is extended or adjusted under 35 U.S.C. 154(b) by 192 days.

(21) Appl. No.: 13/859,848

(22) Filed: Apr. 10, 2013

(65) Prior Publication Data

US 2014/0306678 A1    Oct. 16, 2014

(51) Int. Cl.

| H03K 17/0412 | (2006.01) |
|---|---|
| H02M 1/08 | (2006.01) |
| H03K 19/003 | (2006.01) |
| G05F 1/565 | (2006.01) |
| G05F 1/571 | (2006.01) |
| G05F 1/569 | (2006.01) |

(52) U.S. Cl.
CPC ............ H02M 1/08 (2013.01); H03K 17/04123 (2013.01); H03K 19/003 (2013.01); *G05F 1/565* (2013.01); *G05F 1/569* (2013.01); *G05F 1/571* (2013.01); *H03K 19/00307* (2013.01)

(58) Field of Classification Search
USPC .......... 327/172, 524, 536; 323/273–280, 283; 315/116, 81, 294; 361/18
See application file for complete search history.

(56) References Cited

U.S. PATENT DOCUMENTS

| 6,218,874 | B1* | 4/2001 | Lerner et al. ................. 327/145 |
| 6,577,152 | B1* | 6/2003 | Durham ........... H03K 19/00346 326/21 |
| 7,113,018 | B2* | 9/2006 | Li et al. ........................ 327/333 |
| 7,268,523 | B2* | 9/2007 | Itoh ........................ G05F 1/573 323/276 |
| 7,667,442 | B2* | 2/2010 | Itoh .............................. 323/276 |
| 8,072,196 | B1* | 12/2011 | Li ............................. G05F 1/56 323/266 |
| 2006/0261877 | A1* | 11/2006 | Welty ........................... 327/427 |
| 2010/0079082 | A1* | 4/2010 | Nishi ................. H05B 33/0815 315/291 |
| 2011/0018509 | A1* | 1/2011 | Tseng et al. .................. 323/280 |
| 2012/0319670 | A1* | 12/2012 | Wang ................... G11C 7/1057 323/311 |

* cited by examiner

*Primary Examiner* — Timothy J Dole
*Assistant Examiner* — Bryan R Perez
(74) *Attorney, Agent, or Firm* — McClure, Qualey & Rodack, LLP

(57) ABSTRACT

A charge module is configured to pre-charge a control node to a pre-charged voltage, such that in a case a control module outputs a control voltage, a drive module is activated according to a gate voltage summed by the control voltage and the pre-charged voltage. The charge module includes a first switch, a charge switch, and a second switch. The first switch is configured to provide a first voltage to an operation node. The charge switch is configured to be switched on corresponding to the first voltage of the operation node, so as to charge the control node. The second switch is configured to provide a second voltage to the operation node according to the gate voltage.

20 Claims, 7 Drawing Sheets

CHARGE MODULE, DRIVING CIRCUIT, AND OPERATING METHOD

BACKGROUND

1. Technical Field

The present disclosure relates to an electrical circuit. More particularly, the present invention relates to a driving circuit, a charge module therein and an operating method applied to the driving circuit.

2. Description of Related Art

With advances in electronic technology, various driving circuits have been applied in our daily live.

Generally, a driving circuit includes a power metal oxide semiconductor (MOS) for being activated according to a control voltage, so as to enable a driving current to pass through the power MOS to drive a corresponding component, such as a light emitting diode (LED) module used as indoor/outdoor illumination or screen backlight of an electronic device. In implementation, a coupling capacitor is connected to the gate end of the power MOS and blocks the turn-on speed of the power MOS and the driving circuit. Accordingly, while the driving circuit performs a dimming operation of the LED module in high frequency, errors and deviations may occur and cause inaccuracy of the dimming operation and instability of the driving circuit.

Thus, a driving circuit with a high turn-on speed is desired.

SUMMARY

One aspect of the present invention is directed to a charge module. In accordance with one embodiment of the present invention, the charge module is configured to pre-charge a control node to a pre-charged voltage, such that in a case a control module outputs a control voltage, a drive module is activated according to a gate voltage summed by the control voltage and the pre-charged voltage. The charge module includes a first switch, a charge switch, and a second switch. The first switch is configured to provide a first voltage to an operation node. The charge switch is configured to be switched on corresponding to the first voltage of the operation node, so as to charge the control node. The second switch is configured to provide a second voltage to the operation node according to the gate voltage. In a case that the gate voltage is greater than a predetermined voltage, the second switch provides the second voltage to the operation node, such that the charge switch is switched off and the control node does not be charged.

Another aspect of the present invention is directed to a driving circuit. In accordance with one embodiment of the present invention, the driving circuit includes a drive module, a sensing module, a control module, and a charge module. The charge module configured to pre-charge a control node to a pre-charged voltage. The drive module configured to be activated according to a gate voltage summed by a control voltage and the pre-charged voltage, so as to enable a driving current to pass through the drive module. The sensing module configured to receive the driving current and to output a feedback voltage according to the driving current. The control module configured to receive a reference voltage, the feedback voltage, and a pulse width modulation signal, and configured to output the control voltage to the drive module according to the reference voltage, the feedback voltage, and the pulse width modulation signal.

Still another aspect of the present invention is directed to an operating method applied to a driving circuit. In accordance with one embodiment of the present invention, the operating method includes: pre-charging a control node to a pre-charged voltage; generating a control voltage according to a reference voltage, a feedback voltage, and a pulse width modulation signal; activating a drive module according to a gate voltage summed by the control voltage and the pre-charged voltage, so as to enable a driving current to pass through the drive module; and generating the feedback voltage according to the driving current.

Thus, through application of one of the embodiments mentioned above, the charge module can be implemented. In addition, by charging the gate voltage to the pre-charged voltage through the charge module, the driving circuit includes the charge module can have a high turn-on speed.

BRIEF DESCRIPTION OF THE DRAWINGS

The invention can be more fully understood by reading the following detailed description of the embodiment, with reference made to the accompanying drawings as follows:

FIG. 3b is a schematic diagram of one embodiment of the one-shot pulse generator in FIG. 3a;

DETAILED DESCRIPTION

Figure 1:
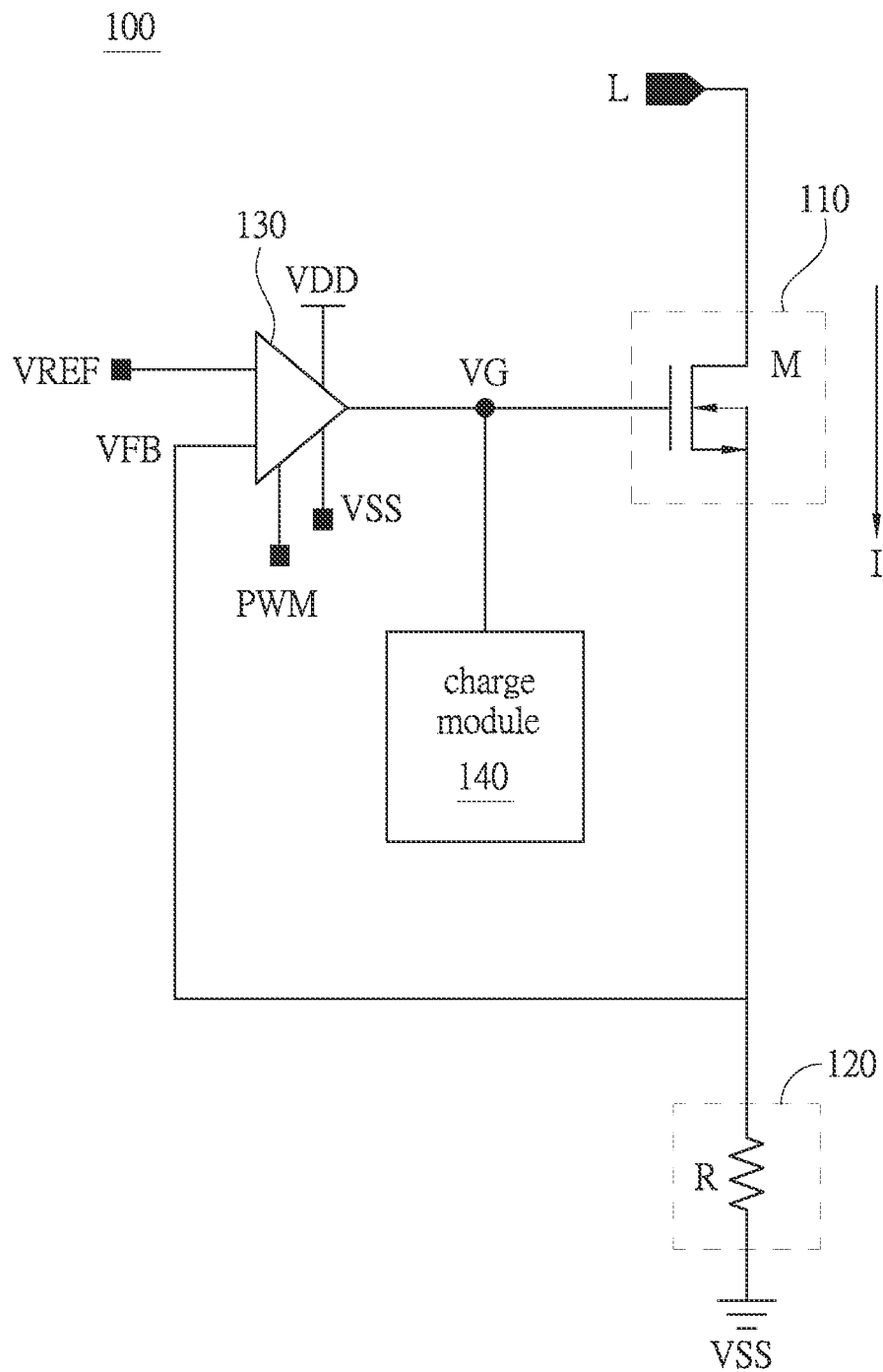
FIG. 1 is a schematic diagram of a driving circuit in accordance with one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

For the term "electrically connect" or "connect" used herein, both of them can refer to the physical contact or electrical contact performed directly or indirectly between two or more elements. The term "electrically connect" or "connect" can further refer to the interoperation or interaction between two or more elements.

One aspect of the invention provides a driving circuit. For the purpose of clear description, a LED current sink circuit will be taken as an example in the following paragraphs. However, the invention is not limited to the embodiment following described.

FIG. 1 is a schematic diagram of a driving circuit 100 in accordance with one embodiment of the present disclosure. The driving circuit 100 can include a driving module 110, a sensing module 120, a control module 130, and a charge module 140. In the present embodiment, the driving module 110 is electrically connected to the sensing module 120, the control module 130, the charge module 140, and a LED end L configured to be connected with a LED module (not shown). The sensing module 120 can be electrically connected to the control module 130. The control module 130 can be electrically connected with the charge module 140.

In this embodiment, the driving module 110 can include a transistor M1 (e.g., a power MOSFET). In addition, although a N-type transistor is illustrated in FIG. 1, one person skilled in the art can easily replace the N-type transistor to a P-type transistor, and thus, the type of the transistor M is not limited to which of the embodiment shown in FIG. 1. The sensing module 120 can include a resistor R. The control module 130 can be implemented by one or more amplifiers. The transistor M1 can be electrically connected between the LED end L and the resistor R, and the gate end (i.e., the control node VG) of the transistor M1 can be electrically connected to the control module 130 and the charge module 140. In addition, a coupling capacitor C (not shown) can be connected to the gate end of the transistor M1. The resistor R can be connected between the transistor M1 and a second voltage VSS.

In this embodiment, the charge module 140 is configured to pre-charge a control node VG to a pre-charged voltage. The driving module 110 is configured to be activated according to a gate voltage summed by the pre-charged voltage and a control voltage, so as to enable a driving current I to pass through the drive module 110. The value of the driving current I corresponds to the value of the gate voltage. The sensing module 120 is configured to receive the driving current I and to output a feedback voltage VFB according to the driving current I. The control module 130 is configured to receive a reference voltage VREF, the feedback voltage VFB, and a pulse width modulation signal PWM, and is configured to output a control voltage to the drive module 110 according to the reference voltage VREF, the feedback voltage VFB, and the pulse width modulation signal PWM to activate the drive module 110, and to adjust the value of the driving current I. In addition, the control module 130 further configured to receive a first voltage VDD and the second voltage VSS for operating. The reference voltage VREF can be a fixed value, and the feedback voltage VFB can be a varying value.

By pre-charging the control node VG (i.e., pre-charging the coupling capacitor C) to the pre-charged voltage through the charge module 140, in a case that the control module 130 outputs the control voltage, the drive module 110 can be activated rapidly according to the gate voltage summed by the control voltage and the pre-charged voltage, such that the time period for activating the drive module 110 can be shortened, and a driving circuit with a high turn-on speed can be implemented.

For example, in a case that the threshold voltage to activate the drive module 110 is 0.7V, if the charge module 140 can pre-charge the control node VG to 0.5V, then the control module 130 can just charge the control node VG from 0.5V to 0.7V to activate the drive module 110, such that the time period for the control module 130 for activating the drive module 110 can be shortened.

Figure 2A:
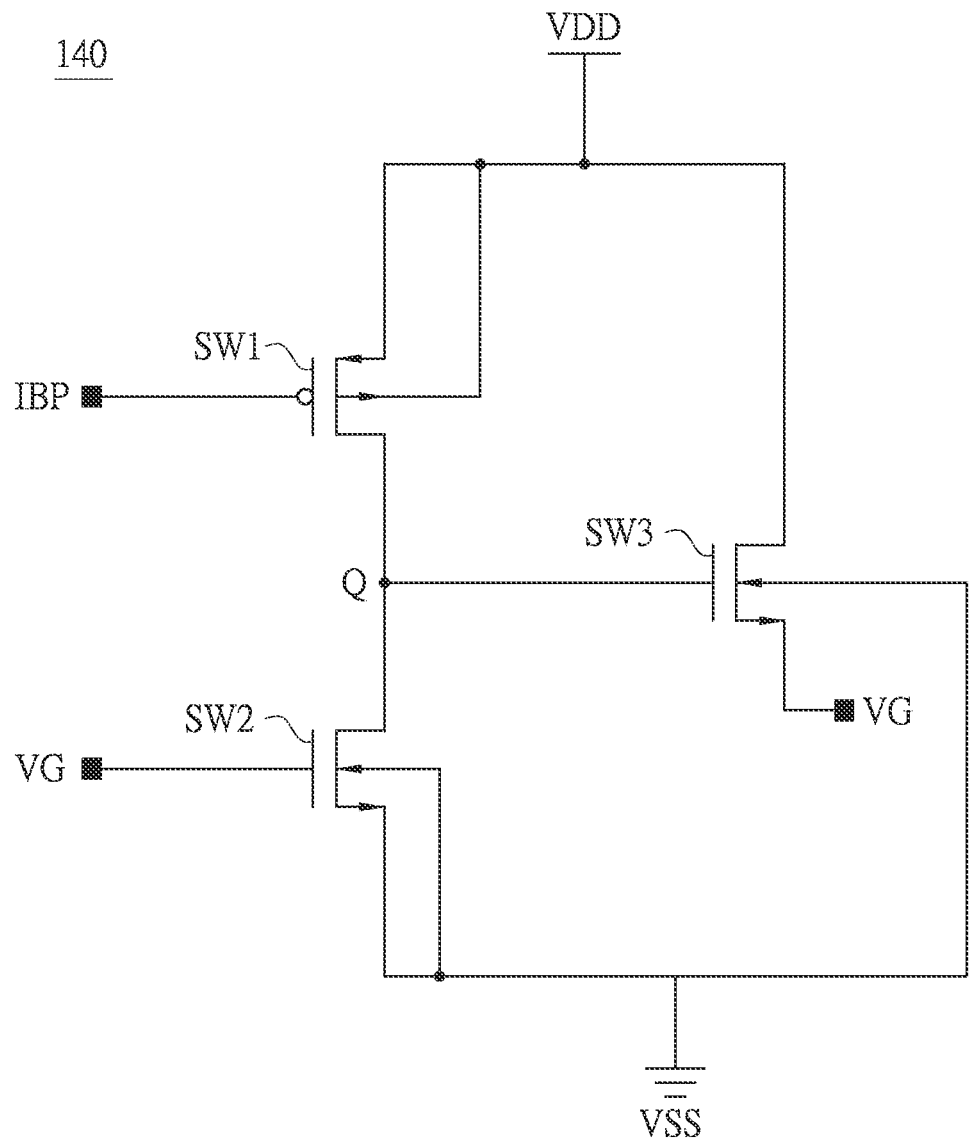
FIG. 2a is a schematic diagram of a charge module in accordance with one embodiment of the present disclosure.

FIG. 2a is a schematic diagram of the charge module 140 in accordance with a first embodiment of the present disclosure. In this embodiment, the charge module 140 can include a switch SW1, a switch SW2, and a switch SW3. The switch SW1 can be electrically connected between the first voltage VDD and an operation node Q. The switch SW2 can be electrically connected between the second voltage VSS and the operation node Q. The switch SW3 can be electrically connected between the first voltage VDD and the control node VG.

In this embodiment, the switch SW1 is configured to receive an operating signal IBP, and according to the operating signal IBP to provide the first voltage VDD to the operation node Q. The switch SW2 is configured to determine whether the gate voltage is greater than a predetermined voltage, and to provide the second voltage VSS to the operation node Q according to the gate voltage. The switch SW3 is configured to be switched on corresponding to the first voltage VDD of the operation node Q, so as to charge the control node VG (i.e., to charge the coupling capacitor C). It should be noted that, in one embodiment, the switch SW1 can be a current source.

In addition, in one embodiment, each of the switches SW1-SW3 can include a transistor, such as a MOSFET. It should be noted that, although the switch SW1 includes a p-type transistor, the switch SW2 includes a n-type transistor, and the switch SW3 includes a n-type transistor as shown in FIG. 2a, one person skilled in the art can easily replace the N-type transistor to the P-type transistor and replace the P-type transistor to the N-type transistor. Thus, the types of the transistors are not limited to those of the embodiment shown in FIG. 2a. Moreover, in one embodiment, the predetermined voltage is equal to the threshold voltage of the transistor of the switch SW2 and is slightly less than the threshold voltage of the transistor M.

In a first operation that the gate voltage is not greater than a predetermined voltage, the switch SW2 is switched off. At this time, the switch SW1 is switched on and conducts the first voltage VDD with the operation node Q. The switch SW3 is switched on according to the first voltage VDD of the operation node Q, such that the control node VG is charged and the gate voltage is increased.

In a second operation that at a period the gate voltage is greater than the predetermined voltage, the switch SW2 is switched on and conducts the second voltage VSS with the operation node Q. The switch SW3 is switched off according to the second voltage VSS of the operation node Q, and the control node VG does not be charged.

In such a configuration, the control node VG can be charged to the pre-charged voltage, and therefore, the time period for activating the drive module 110 can be shortened, and a driving circuit with a high turn-on speed can be realized.

Figure 2B:
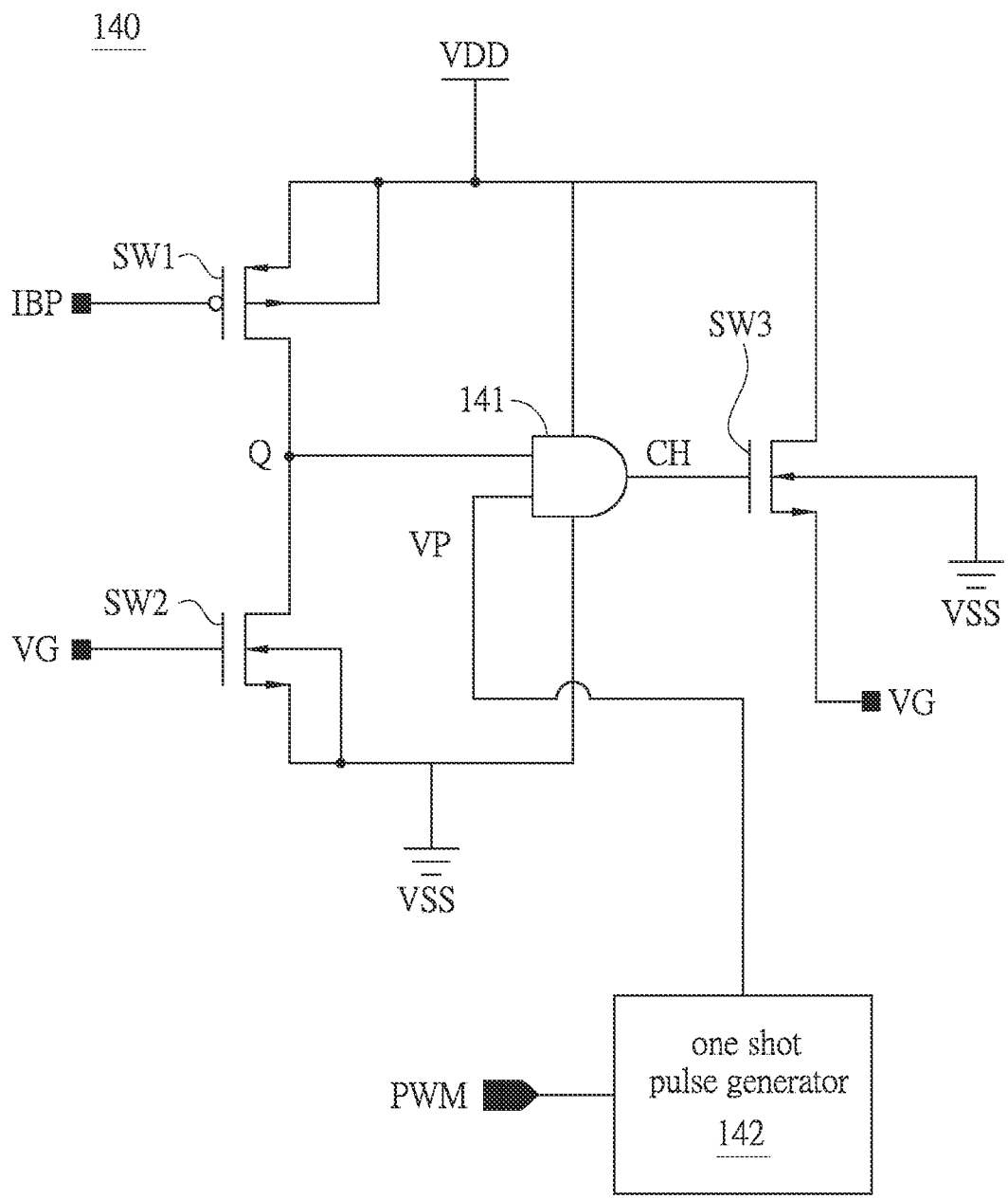
FIG. 2b is a schematic diagram of a charge module in accordance with another embodiment of the present disclosure.

FIG. 2b is a schematic diagram of a charge module 140 in accordance with a second embodiment of the present disclosure. Aspects of this embodiment that are similar to those of the previous embodiment shown in FIG. 2a will not be repeated. In this embodiment, the charge module 140 can further include a logic unit (e.g., an AND gate) 141, and a one-shot pulse generator 142. The first input end of the logic unit 141 is electrically connected to the operation node Q, the second input end of the logic unit 141 is electrically connected to the one-shot pulse generator 142, and the output end of the logic unit 141 is electrically connected to the gate end of switch SW3.

In this embodiment, the logic unit 141 is configured to receive the first voltage VDD or the second voltage VSS of the operation node Q and to receive a one-shot pulse VP, to operatively output a charge signal CH to the switch SW3 according to the first voltage VDD or the second voltage VSS of the operation node Q and the one-shot pulse VP. The one-shot pulse generator 142 is configured to receive the pulse width modulation signal PWM, and according the pulse width modulation signal PWM to output the one-shot pulse VP to the logic unit 141.

In this embodiment, the one-shot pulse VP can be a pulse signal having a high voltage level corresponding to positive edge of the pulse width modulation signal PWM and being pulled down to a low voltage level in a short time (e.g., 2 μs). In other words, a phase and a period of the one-shot pulse VP are the same as a phase and a period of the pulse width modulation signal PWM, and a duty cycle of the one-shot pulse VP is shorter than a duty cycle of the pulse width modulation signal PWM.

In a first operation that the one-shot pulse Vp has the high voltage level and the gate voltage is not greater than the predetermined voltage, the switch SW2 is switched off, and the switch SW1 is switched on to conduct the first voltage VDD with the operation node Q. The logic unit 141 outputs the charge signal CH (e.g., with the high voltage level) to the switch SW3, such that the switch SW3 is switched on, the control node VG is charged, and the gate voltage is increased.

In a second operation that at a period the gate voltage is greater than the predetermined voltage, the switch SW2 is switched on to conduct the second voltage VSS to the operation node Q. The logic unit 141 does not output the charge signal CH, such that the switch SW3 is switched off and the control node VG does not be charged.

In a third operation that the one-shot pulse Vp has the low voltage level, the logic unit 141 does not output the charge signal CH, such that the switch SW3 is switched off and the control node VG does not be charged.

In such a configuration, the control node VG can be charged to the pre-charged voltage, such that the time period for activating the drive module 110 can be shortened, and a driving circuit with a high turn-on speed can be realized.

In addition, the control node VG can be charged just in the period the one-shot pulse Vp has the high voltage level, such that a protection mechanism for over-charging can be implemented.

Figure 3A:
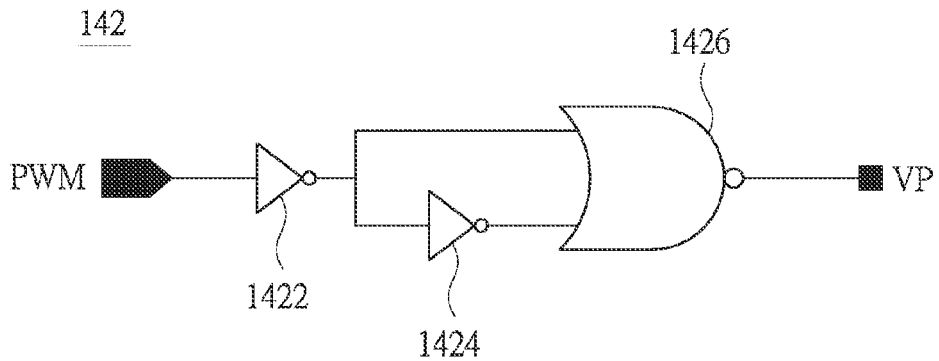
FIG. 3a is a schematic diagram of a one-shot pulse generator in accordance with one embodiment of the present disclosure.
Figure 3B:
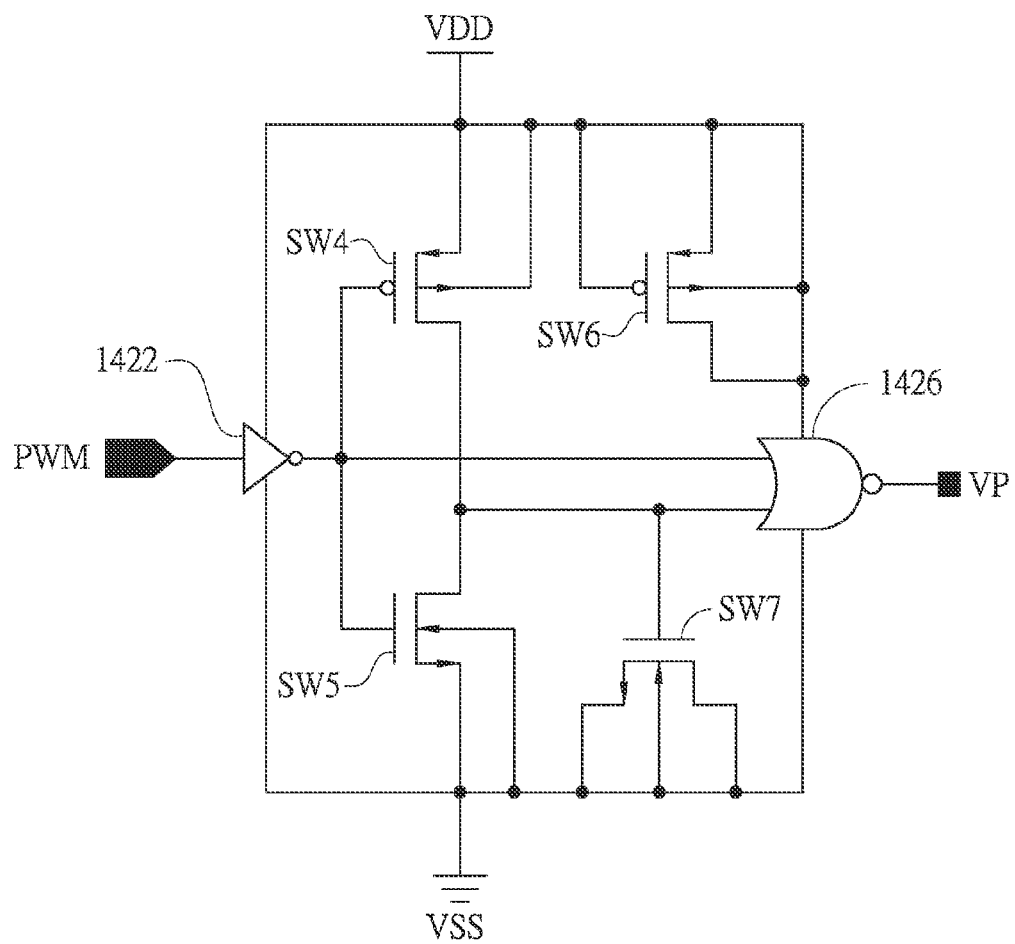

Referring to FIG. 3a and FIG. 3b, FIG. 3a is a schematic diagram of the one-shot pulse generator 142 in accordance with one embodiment of the present disclosure. The one-shot pulse generator 142 can include an inverter 1422, an inverter 1424, and a NOR gate 1426. The inverter 1422 is configured to receive the pulse width modulation signal PWM and to invert the pulse width modulation signal PWM to generate an inverted pulse width modulation signal. The inverter 1424 is configured to receive the inverted pulse width modulation signal from the inverter 1422 and to invert and to delay the inverted pulse width modulation signal to generate a delayed pulse width modulation signal. The NOR gate 1426 is configured to receive the inverted pulse width modulation signal from the inverter 1422 and the delayed pulse width modulation signal from the inverter 1424, so as to generate the one-shot pulse Vp according to the inverted pulse width modulation signal and the delayed pulse width modulation signal.

FIG. 3b is a schematic diagram of one embodiment of the one-shot pulse generator 142 in FIG. 3a. In this embodiment, the one-shot pulse generator 142 can includes the inverter 1422, the NOR gate 1426, switches SW4-SW7. The connections between the components above are illustrated in FIG. 3b, and it would not be described herein.

In such a configuration, the one-shot pulse generator 142 can be implemented.

Another aspect of the present invention provides an operating method 400. The operating method can be applied to the driving circuit 100 previously described. In the following paragraphs, the driving circuit 100 would be taken as descriptive examples. However, the operating method 400 is not limited to be applied to the driving circuit 100 previously described.

It should be noted that the steps of the operating method 400 are not specifically sequenced, unless otherwise specified. Additionally, the following steps also may be executed at the same time, or the execution time thereof may be overlapped.

Figure 4:
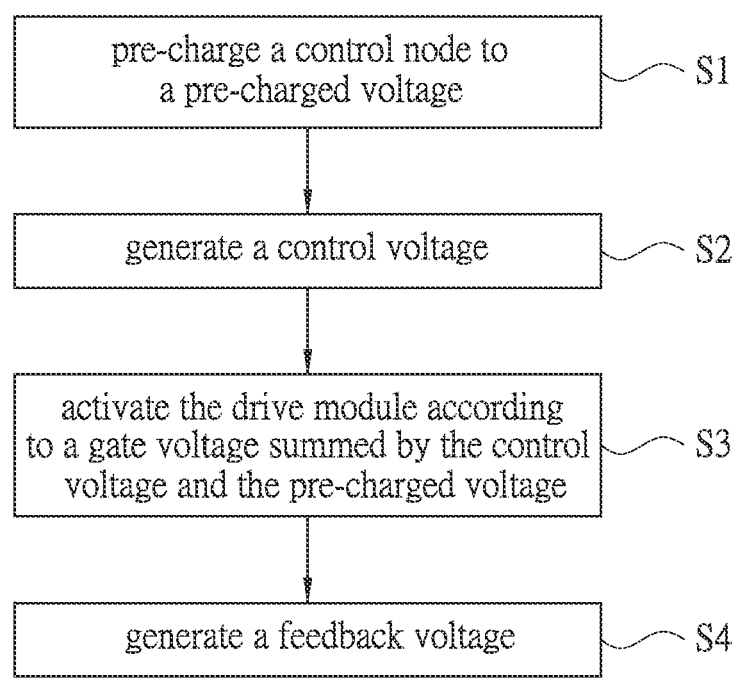
FIG. 4 is a flow chat of an operating method in accordance with one embodiment of the present disclosure.

Referring to both FIG. 1 and FIG. 4, FIG. 4 is a flow chat of the operating method 400a in accordance with one embodiment of the present disclosure. The operating method 400a includes the following steps. A control node VG is pre-charged to a pre-charged voltage through the charge module 140 (step S1). A control voltage is generated according to a reference voltage, a feedback voltage, and a pulse width modulation signal through the control module 130 (step S2). The drive module 110 is activated according to a gate voltage summed by the control voltage and the pre-charged voltage, so as to enable a driving current I to pass through the drive module 110 (step S3). The feedback voltage is generated according to the driving current I through the sensing module 120.

In such a manner, the time period for activating the drive module 110 can be shortened.

Figure 5A:
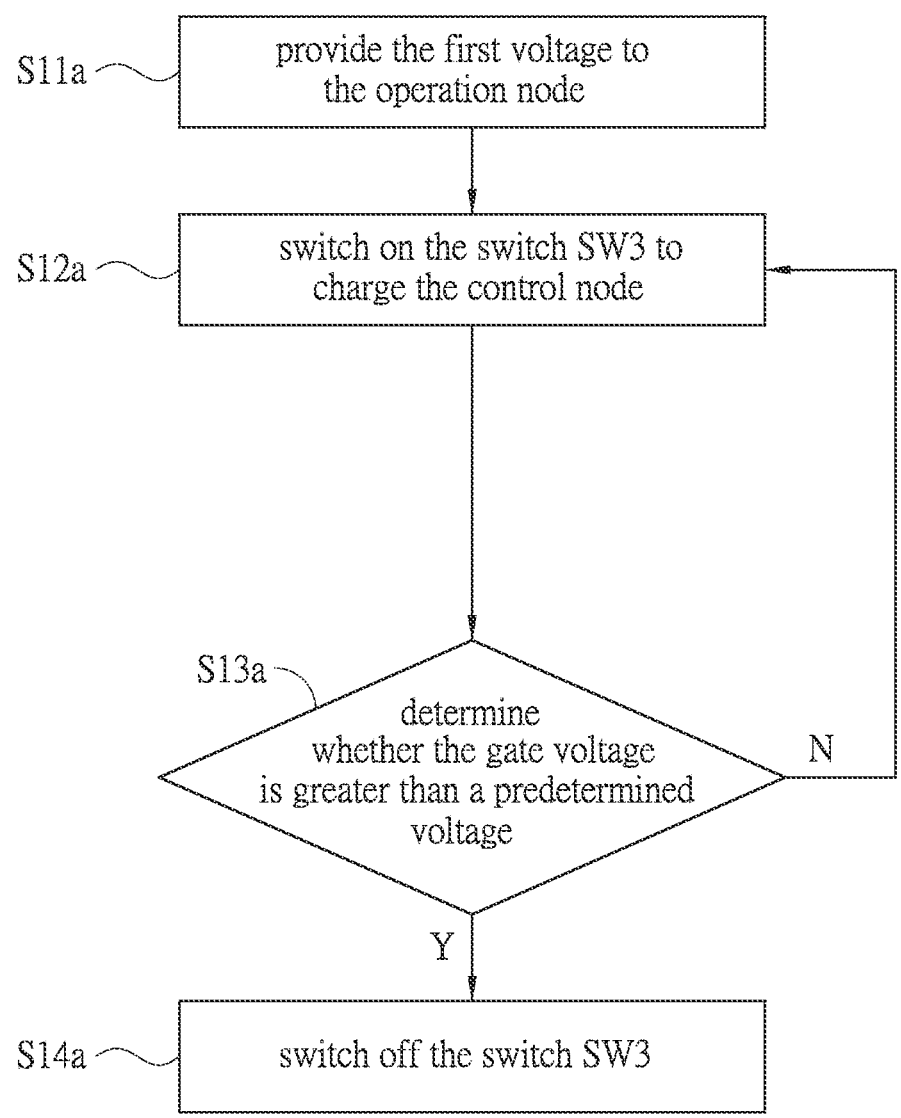
FIG. 5a is a flow chat of one step of the operating method in accordance with one embodiment of the present disclosure.

Referring to both FIG. 2a and FIG. 5a, in one embodiment, step S1 includes the following steps. First, the first voltage VDD is provided to the operation node Q through the switch SW1 (step S11a). Then, the switch SW3 is switched on according to the first voltage VDD of the operation node Q, so as to charge the control node VG (step S12a). Subsequently, the switch SW2 determines whether the gate voltage is greater than a predetermined voltage (step S13a). If so, then the second voltage VSS is provided to the operation node Q through the switch SW2, such that the switch SW3 is switched off and the control node VG does not be charged (step S4a). If not, then the routine returns back to step S12a.

In one embodiment, the step S14a includes a step of providing the second voltage VSS to the operation node Q through a transistor within the switch SW2. The predetermined voltage is equal to the threshold voltage of the transistor within the switch SW2.

Figure 5B:
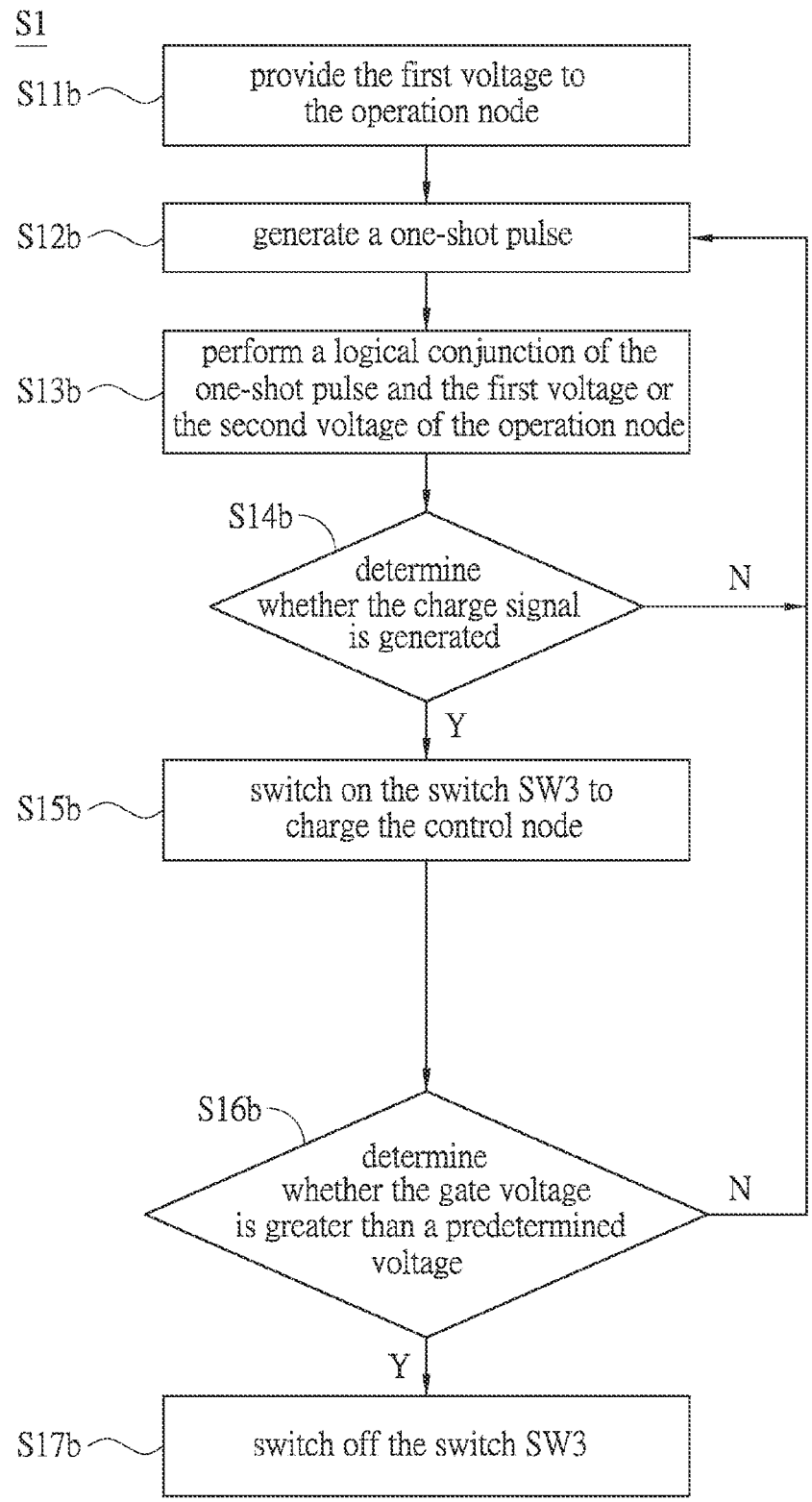
FIG. 5b is a flow chat of the one step of the operating method in accordance with another embodiment of the present disclosure.

On the other hand, referring to FIG. 2b, FIG. 3a and FIG. 5b, in one embodiment, step S1 includes the following steps. The first voltage VDD is provided to the operation node Q through the switch SW1 (step S11b). A one-shot pulse VP is generated according to a pulse width modulation signal PWM through the one-shot pulse generator 142 (step S12b). A logical conjunction of the one-shot pulse VP and the first voltage VDD or the second voltage VSS of the operation node Q is performed through the logic unit 141 (e.g., an AND gate) to operatively generate a charge signal CH (e.g., having a high voltage level)(step S13b). The switch SW3 determines whether the charge signal CH is generated (step S14b). If not, then the step S4b is continuously performed. If so, then the switch SW3 is switched on, so that the control node VG can be charged and increased (step S15b). Then, the switch SW2 determines whether the gate voltage is greater than a predetermined voltage (step S16b). If so, then the second voltage VSS is provided to the operation node Q through the switch SW2 (step S17b). If not, then the routine returns back to step S14b.

It should be noted that, details of the predetermined voltage can be referred to which of the previous embodiment and would not be repeated herein.

In addition, in one embodiment, a phase and a period of the one-shot pulse VP are the same as a phase and a period of the pulse width modulation signal PWM, and a duty cycle of the one-shot pulse VP is shorter than a duty cycle of the pulse width modulation signal PWM.

Furthermore, in one embodiment, step S12b can includes the following steps. An inverted pulse width modulation signal is generated by inverting a pulse width modulation signal PWM through the inverter 1422. A delayed pulse width modulation signal is generated by inverting and delaying the inverted pulse width modulation signal through the inverter 1424. Thereafter, the NOR gate 1426 performing a NOR function of the inverted pulse width modulation signal and the delayed pulse width modulation signal, so as to generate the one-shot pulse VP.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A charge module configured to pre-charge a control node to a pre-charged voltage, such that in a case a control module outputs a control voltage, a drive module is activated according to a gate voltage summed by the control voltage and the pre-charged voltage, wherein the charge module comprises:
    a first switch configured to provide a first voltage to an operation node;
    a charge switch configured to be switched on corresponding to the first voltage of the operation node, so as to charge the control node via an end of the charge switch; and
    a second switch configured to receive the gate voltage on the control node via a control end of the second switch and provide a second voltage to the operation node according to the gate voltage, wherein both of the control end of the second switch and the end of the charge switch are connected to the control node;
    wherein, in a first case that the gate voltage is not greater than a predetermined voltage, in one operating state of charging the control node, the first switch is switched on, the second switch is switched off, and the charge switch is switched on concurrently,
    and in a second case that the gate voltage is greater than the predetermined voltage, the second switch provides the second voltage to the operation node, such that the charge switch is switched off and the control node does not be charged.

2. The charge module as claimed in claim 1, wherein the second switch comprises a transistor, and the predetermined voltage is equal to the threshold voltage of the transistor.

3. The charge module as claimed in claim 1, further comprising:
    a logic unit configured to receive the first voltage or the second voltage of the operation node and to receive a one-shot pulse, so as to operatively output a charge signal to switch on the charge switch according to the first voltage or the second voltage of the operation node and the one-shot pulse.

4. The charge module as claimed in claim 3, wherein, in a case that the one-shot pulse has a first voltage level, the logic unit does not output the charge signal, such that the charge switch is switched off and the control node does not be charged.

5. The charge module as claimed in claim 3, wherein, in a case that the one-shot pulse has a second voltage level and the gate voltage of the control node is not greater than the predetermined voltage, the logic unit outputs the charge signal, such that the charge switch is switched on and the control node is charged.

6. The charge module as claimed in claim 1, further comprising:
    a one-shot pulse generator configured to generate the one-shot pulse according to a pulse width modulation signal, wherein a phase of the one-shot pulse is the same as a phase of the pulse width modulation signal, and a duty cycle of the one-shot pulse is shorter than a duty cycle of the pulse width modulation signal.

7. The charge module as claimed in claim 6, wherein the one-shot pulse generator comprising:
    a first inverter configured to receive the pulse width modulation signal and to invert the pulse width modulation signal so as to generate an inverted pulse width modulation signal;
    a second inverter configured to receive the inverted pulse width modulation signal and to invert and to delay the inverted pulse width modulation signal so as to generate a delayed pulse width modulation signal; and
    a NOR gate configured to receive the inverted pulse width modulation signal and the delayed pulse width modulation signal, so as to generate the one-shot pulse according to the inverted pulse width modulation signal and the delayed pulse width modulation signal.

8. A driving circuit, comprising:
    a charge module configured to pre-charge a control node to a pre-charged voltage, wherein the charge module comprises a first switch, a charge switch, and a second switch, the first switch is configured to provide a first voltage to an operation node, the charge switch is configured to be switched on corresponding to the first voltage of the operation node to charge the control node, the second switch is configured to provide a second voltage to the operation node, in one operating state of charging the control node, the first switch is switched on, the second switch is switched off, and the charge switch is switched on concurrently, and a control end of the second switch and one end of the charge switch are connected to the control node;
    a drive module configured to be activated according to a gate voltage summed by a control voltage and the pre-charged voltage, so as to enable a driving current to pass through the drive module;
    a sensing module configured to receive the driving current and to output a feedback voltage according to the driving current; and
    a control module configured to receive a reference voltage, the feedback voltage, and a pulse width modulation signal, and configured to output the control voltage to the drive module according to the reference voltage, the feedback voltage, and the pulse width modulation signal.

9. The driving circuit as claimed in claim 8, wherein the charge module comprises:
    a first switch electrically connected between a first voltage and an operation node, wherein the first switch is configured to conduct the first voltage with the operation node;
    a charge switch electrically connected between the first voltage and the gate voltage, wherein the charge switch is configured to be switched on corresponding to the first voltage of the operation node, so as to charge the control node; and
    a second switch electrically connected between a second voltage and the operation node, wherein the second switch is configured to conduct the second voltage with the operation node at a period the gate voltage is greater than the predetermined voltage, so as to operatively switch off the charge switch.

10. The driving circuit as claimed in claim 9, wherein the drive module comprises a transistor, and the predetermined voltage is smaller than the threshold voltage of the transistor in the drive module.

11. The driving circuit as claimed in claim 9, wherein the charge module further comprises:
a logic unit configured to receive the first voltage or the second voltage of the operation node and to receive a one-shot pulse, so as to operatively output a charge signal to switch on the charge switch according to the first voltage or the second voltage of the operation node and the one-shot pulse.

12. The driving circuit as claimed in claim 11, wherein the charge module further comprises:
a one-shot pulse generator configured to generate the one-shot pulse according to the pulse width modulation signal, wherein a phase of the one-shot pulse is the same as a phase of the pulse width modulation signal, and a duty cycle of the one-shot pulse is shorter than a duty cycle of the pulse width modulation signal.

13. The driving circuit as claimed in claim 12, wherein the one-shot pulse generator comprises:
a first inverter configured to receive the pulse width modulation signal and to invert the pulse width modulation signal to generate an inverted pulse width modulation signal;
a second inverter configured to receive the inverted pulse width modulation signal and to invert and to delay the inverted pulse width modulation signal to generate a delayed pulse width modulation signal; and
a NOR gate configured to receive the inverted pulse width modulation signal and the delayed pulse width modulation signal, so as to generate the one-shot pulse according to the inverted pulse width modulation signal and the delayed pulse width modulation signal.

14. The driving circuit as claimed in claim 11, wherein, in a case that the one-shot pulse has a first voltage level, the logic unit does not output the charge signal, such that the charge switch is switched off and the gate voltage does not be charged.

15. The driving circuit as claimed in claim 11, wherein, in a case that the one-shot pulse has a second voltage level and the gate voltage is not greater than the predetermined voltage, the logic unit output the charge signal, such that the charge switch is switched on and the control node is charged.

16. The driving circuit as claimed in claim 8, wherein the second switch comprises a transistor, the predetermined voltage is equal to the threshold voltage of the transistor in the second switch.

17. An operating method applied to a driving circuit, wherein the operating method comprises the steps of:
pre-charging, through a charge module, a control node to a pre-charged voltage;
generating a control voltage according to a reference voltage, a feedback voltage, and a pulse width modulation signal;
activating a drive module according to a gate voltage summed by the control voltage and the pre-charged voltage, so as to enable a driving current to pass through the drive module; and
generating the feedback voltage according to the driving current;
wherein the step of pre-charging the control node to the pre-charged voltage comprises:
charging the control node by switching on a first switch of the charge module to charge an operation node to a first voltage, switching off a second switch of the charge module, and switching on a charge switch of the charge module according to the first voltage on the operation node,
wherein the second switch is configured to provide a second voltage to the operation node according to the gate voltage,
in one operating state, the first switch is switched on, the second switch is switched off, and the charge switch is switched on concurrently,
and a control end of the second switch and one end of the charge switch are connected to the control node.

18. The operating method as claimed in claim 17, wherein the step of pre-charging the control node to the pre-charged voltage comprises:
providing a first voltage to an operation node;
opening a charge switch according to the first voltage of the operation node, so as to charge the control node; and
determining whether the gate voltage is greater than a predetermined voltage;
in a case that the gate voltage is greater than the predetermined voltage, providing the second voltage to the operation node, such that the charge switch is switched off and the control node does not be charged.

19. The operating method claimed in claim 18, wherein the step of pre-charging the control node to the pre-charged voltage further comprises:
generating a one-shot pulse according to a pulse width modulation signal, wherein a phase of the one-shot pulse is the same as a phase of the pulse width modulation signal, and a duty cycle of the one-shot pulse is shorter than a duty cycle of the pulse width modulation signal;
through an AND gate, performing a logical conjunction of the first voltage or the second voltage of the operation node and the one-shot pulse to operatively generate a charge signal;
determining whether the charge signal is generated; and
opening the charge switch if the charge signal is generated.

20. The operating method claimed in claim 19, wherein the step of generating the one-shot pulse comprises:
inverting a pulse width modulation signal to generate an inverted pulse width modulation signal;
inverting and delaying the inverted pulse width modulation signal to generate a delayed pulse width modulation signal; and
through an NOR gate, performing a NOR function of the inverted pulse width modulation signal and the delayed pulse width modulation signal, so as to generate the one-shot pulse.

* * * * *